(12) United States Patent
Park (10) Patent No.: US 7,312,568 B2
(45) Date of Patent: Dec. 25, 2007

(54) ORGANIC ELECTRO LUMINESCENCE DEVICE HAVING TFT WITH PROTRUSIONS

(75) Inventor: Jae Yong Park, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 125 days.

(21) Appl. No.: 10/964,967

(22) Filed: Oct. 15, 2004

(65) Prior Publication Data

US 2005/0162070 A1    Jul. 28, 2005

(30) Foreign Application Priority Data

Dec. 29, 2003    (KR)    ...................... 10-2003-0099399

(51) Int. Cl.
*H05B 33/02* (2006.01)

(52) U.S. Cl. ...................... 313/504; 313/500

(58) Field of Classification Search ........ 313/498–512; 315/169.3; 345/36, 45, 76
See application file for complete search history.

(56) References Cited

U.S. PATENT DOCUMENTS

| | | | |
|---|---|---|---|
| 5,737,041 A * | 4/1998 | Holmberg et al. ............. | 349/43 |
| 5,747,930 A * | 5/1998 | Utsugi ......................... | 313/504 |
| 5,874,746 A * | 2/1999 | Holmberg et al. ............. | 257/59 |
| 6,066,506 A * | 5/2000 | Holmberg et al. ............. | 438/4 |
| 6,147,362 A * | 11/2000 | Keyser ......................... | 257/59 |
| 6,175,345 B1 * | 1/2001 | Kuribayashi et al. ......... | 345/76 |
| 6,639,281 B2 | 10/2003 | Kane et al. | |
| 6,674,245 B2 * | 1/2004 | Ko et al. .................. | 315/169.3 |
| 6,724,011 B2 * | 4/2004 | Segawa et al. ................ | 257/72 |
| 6,727,871 B1 * | 4/2004 | Suzuki et al. ................. | 345/76 |

FOREIGN PATENT DOCUMENTS

| | | |
|---|---|---|
| JP | 10-065180 | 3/1998 |
| JP | 11-097701 | 4/1999 |
| JP | 2000-150895 | 5/2000 |
| JP | 2003-084686 | 3/2003 |
| JP | 2003-508807 | 3/2003 |
| JP | 2003-204067 | 7/2003 |
| JP | 2003-208108 | 7/2003 |
| JP | 2003-208109 | 7/2003 |
| KR | 2003-0086167 | 11/2003 |
| WO | 02/061837 | 8/2002 |

* cited by examiner

*Primary Examiner*—Nimeshkumar D. Patel
*Assistant Examiner*—Christopher M. Raabe
(74) *Attorney, Agent, or Firm*—Morgan, Lewis & Bockius LLP (57) ABSTRACT

An organic electro luminescence device includes a gate line, a data line intersecting the gate line and defining a pixel area, a power line parallel to the data line, and an array element formed in the pixel area and corresponding to an organic electro luminescence diode, the array element including a switching TFT, a drive TFT and a storage capacitor, and the drive TFT including source and drain electrodes, one of the source and drain electrodes having at least one vertical protrusion, and another of the source and drain electrodes having at least two vertical protrusions.

19 Claims, 6 Drawing Sheets

ORGANIC ELECTRO LUMINESCENCE DEVICE HAVING TFT WITH PROTRUSIONS

The present application claims the benefit of Korean Patent Application No. 99399/2003 filed in Korea on Dec. 29, 2003, which is hereby incorporated by reference.

BACKGROUND OF THE INVENTION

1. Field of the Invention

The present invention relates to an organic electro luminescence device, and more particularly, to structures of a gate electrode and a source/drain electrode of a drive thin film transistor (TFT) in a top emission type organic electro luminescence device.

2. Discussion of the Related Art

In general, an organic electro luminescence device, which also is referred to as an organic light emitting diode (OLED) device, is a self-emission flat panel display device and includes a plurality of pixels and an organic light emitting diode in each of the pixels. Each of the organic light emitting diodes emits light by injecting electrons from a cathode and holes from an anode into an emission layer, combining the electrons with the holes, generating an exciton, and transitioning the exciton from an excited state to a ground state. Accordingly, the organic electro luminescence does not require an additional light source and has a light weight, thin profile, and compact size.

In addition, the organic electro luminescence device generally is manufactured using a relatively simple process including a deposition process and an encapsulation process. Thus, an organic electro luminescence device has a low production cost. Further, the organic electro luminescence device can operate using a low DC voltage, thereby having low power consumption and fast response time. The organic electro luminescence device also has a wide viewing angle, and high image contrast. Moreover, the organic electro luminescence device is an integrated device. Thus, the organic electro luminescence device has high endurance from external impacts and a wide range of applications.

A passive matrix type electro luminescence device that does not have a switching element has been widely used. In the passive matrix type electro luminescence device, scan lines intersect signal lines to define a matrix shape device, and the scan lines are sequentially driven to excite each pixel. However, to achieve a required mean luminescence, a moment luminance needs to be as high as the luminance obtained by multiplying the mean luminescence by the number of lines.

There also exists an active matrix type electro luminescence device, which includes thin film transistors as switching elements within each pixel. The voltage applied to the pixels are charged in a storage capacitor Cst so that the voltage can be applied until a next frame signal is applied, thereby continuously driving the organic electro luminescence device regardless of the number of gate lines until a picture of images is finished. Accordingly, the active matrix type electro luminescence device provides uniform luminescent, even when a low current is applied.

Figure 1:
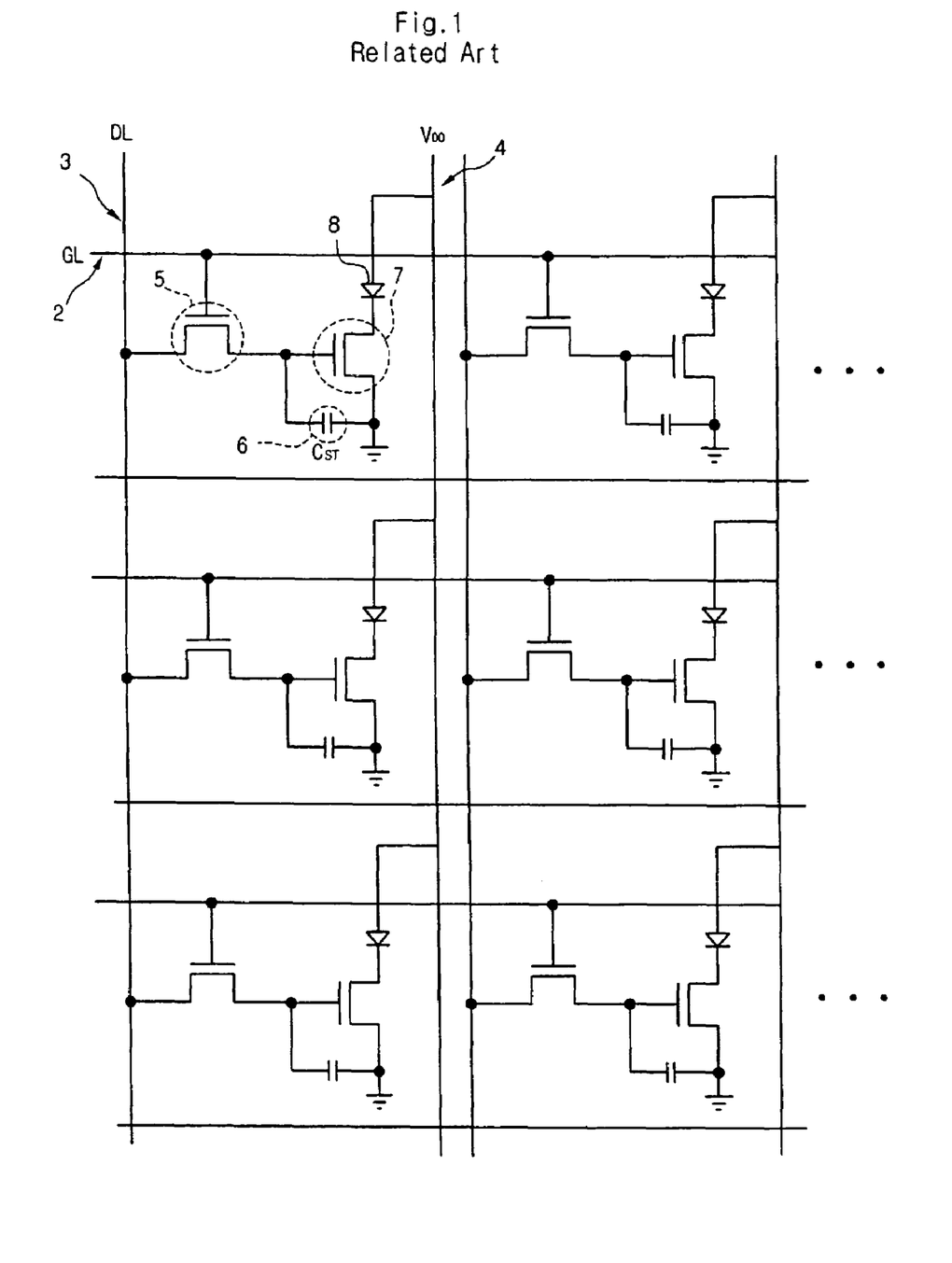
FIG. 1 is a circuit diagram of a pixel structure of an active matrix type organic electro luminescence device according to the related art.

FIG. 1 is a circuit diagram of a pixel structure of an active matrix type organic electro luminescence device according to the related art. In FIG. 1, gate lines 2 are formed along a first direction and data and power lines 3 and 4 are formed along a second direction intersecting the gate lines 2, thereby defining a plurality of sub-pixel regions. In addition, a switching TFT 5 is formed in each of the sub-pixel regions. A storage capacity $C_{st}$ 6 is connected to the switching TFT 5 and the power line 4. A drive TFT 7 that is a current source element is connected to the storage capacitor $C_{st}$ 6 and the power line 4.

An organic electro luminescence diode 8 is connected to the drive TFT 7. When a current is applied to an organic light emitting material of the organic electro luminescence diode 8 in a forward direction, electrons and holes are recombined, moving through a P-N junction between an anode electrode as a hole donor and a cathode electrode as an electron donor. Therefore, the energy of the organic electro luminescence diode 8 becomes lower, thereby generating an energy difference and causing light emission.

Figure 2:
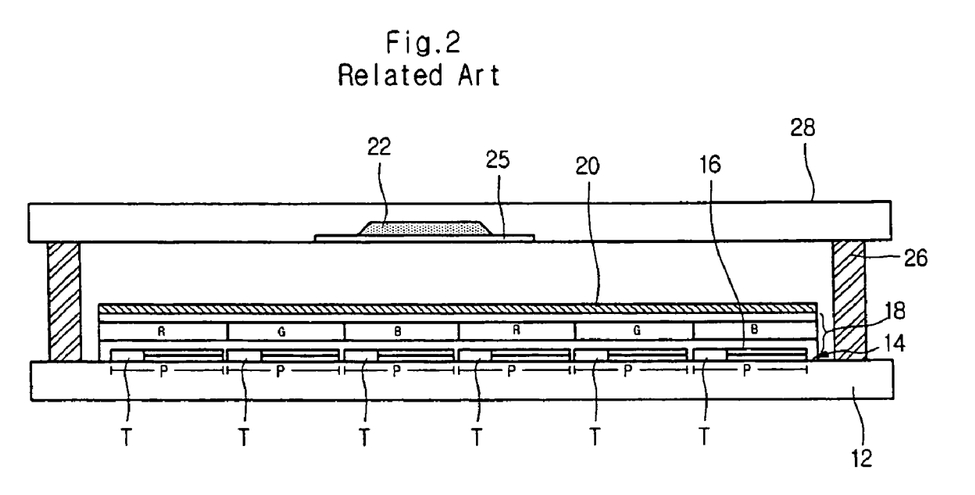
FIG. 2 is a schematic sectional view of a bottom emission type organic electro luminescence device according to the related art.

The organic electro luminescence device may be classified into a top emission type and a bottom emission type based on its light emission direction, and FIG. 2 is a schematic sectional view of a bottom emission type organic electro luminescence device according to the related art. In FIG. 2, an organic electro luminescence device 10 includes a first transparent substrate 12. A TFT array 14, a first electrode 16, an organic luminescent layer 18 and a second electrode 20 are formed on the first substrate 12. The organic luminescent layer 18 includes red, green and blue organic luminescent material R, G, B to corresponding to each of sub-pixels in a pixel P.

The first substrate 12 is adhered to a second substrate 28, on which an absorbent 22 is formed, by a sealant 26, thereby completing the organic electro luminescence device that is encapsulated. The absorbent 22 is for removing moisture and oxygen that may be infiltrated into the encapsulated organic electro luminescence device. In particular, a portion 25 of the second substrate 28 is etched and the absorbent 22 is filled in the etched portion and fixed by a tape. The first and second substrates 12 and 28 are formed of a transparent insulating material such as glass or plastic.

Figure 3:
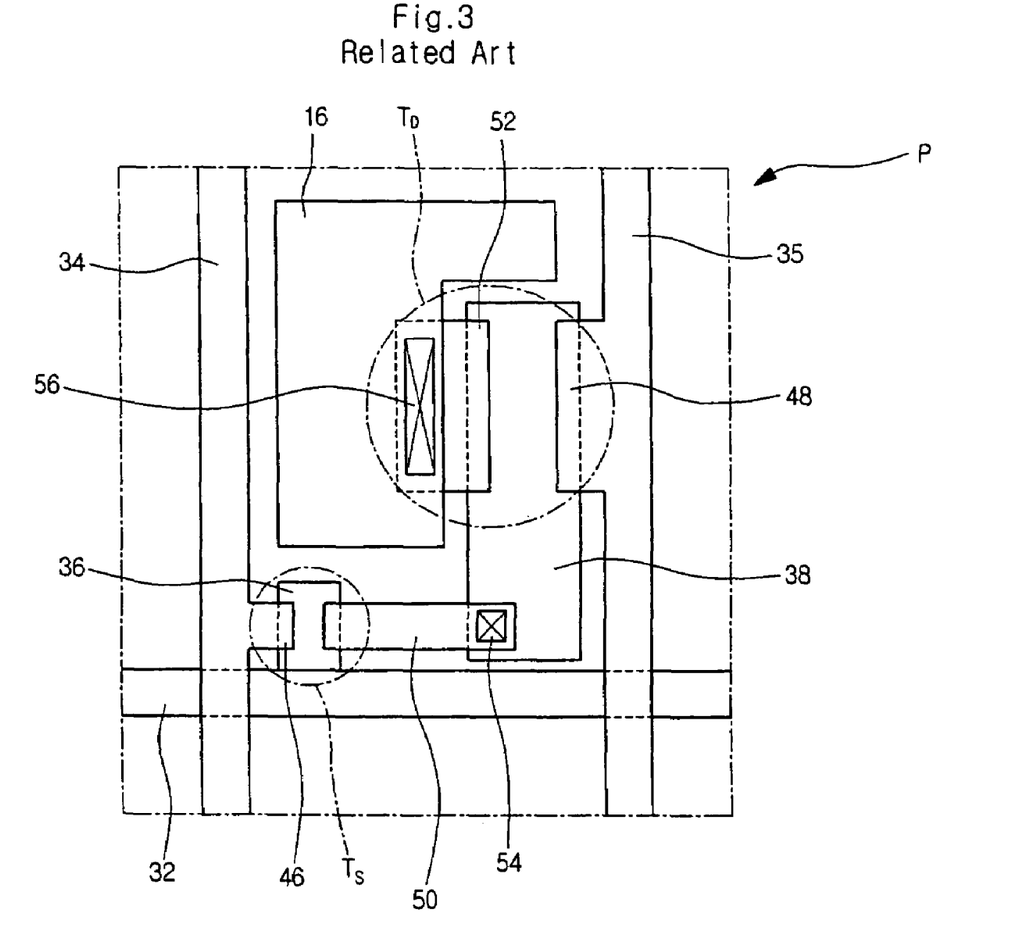
FIG. 3 is a sub-pixel of a TFT array in the organic electro luminescence devices shown in FIGS. 1 and 2.

FIG. 3 is a sub-pixel of a TFT array in the organic electro luminescence devices shown in FIGS. 1 and 2. In FIG. 3, gate lines 32 and data lines 34 intersect each other with an insulating layer formed therebetween and define a pixel region P. In addition, power lines 35 are formed in parallel with the data lines 34. A switching TFT $T_S$ is formed in the pixel region, and is connected to a respective gate line 32 and a respective data line 34. The switching TFT Ts includes a gate electrode 36, an active layer (not shown), a source electrode 46, and a drain electrode 50. The gate electrode 36 of the switching TFT $T_S$ is connected to the gate line 32 and the source electrode 46 is connected to the data line 34. The drain electrode 50 is connected to a gate electrode 38 of a drive TFT $T_D$ through a first contact hole 54. A source electrode 48 of the drive TFT $T_D$ is connected to the power line 35 and a drain electrode 52 of the drive TFT $T_D$ is connected to a first electrode 16 through a second contact hole 56.

The TFT provided on the pixel forms an active layer using amorphous silicon. Since the mobility of the amorphous silicon is lower than that of crystal silicon by 0.5-1 cm²/Vsec, a ratio of a width to a length W/L of the drive TFT $T_D$ needs be increased to drive the organic luminescent layer. The width of the drive TFT $T_D$ is an overlapped portion between the active layer and the source/drain electrode on the gate electrode 38. The length of the drive TFT $T_D$ is a distance between the source and drain electrodes 48 and 52. In order to increase the ratio W/L, the size of the drive TFT $T_D$ also increases.

However, when the size of the drive TFT $T_D$ is increased, the aperture rate of the bottom emission type organic electro luminescence device is reduced. As a result, current density applied to the organic electro luminescence layer is relatively high, and the drive TFT $T_D$ experiences DC stress for many hours, thereby reducing the life span of the organic electro luminescence device.

SUMMARY OF THE INVENTION

Accordingly, the present invention is directed to an organic electro luminescence device that substantially obviates one or more of the problems due to limitations and disadvantages of the related art.

An object of the present invention is to provide an organic electro luminescence device that has a driving thin film transistor having an increased width-to-length ratio (W/L), thereby obtaining a higher definition.

Another object of the present invention is to provide an organic electro luminescence device that has a driving thin film transistor having source and drain electrodes in a comb shape with a plurality of vertical protrusions, thereby obtaining an improved DC reliability and better product life span.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the organic electro luminescence device includes a gate line, a data line intersecting the gate line and defining a pixel area, a power line parallel to the data line, and an array element formed in the pixel area and corresponding to an organic electro luminescence diode, the array element including a switching TFT, a drive TFT and a storage capacitor, and the drive TFT including source and drain electrodes, one of the source and drain electrodes having at least one vertical protrusion, and another of the source and drain electrodes having at least two vertical protrusions.

In another aspect, the organic electro luminescence device includes first and second substrates facing each other with a predetermined space therebetween, an array element formed on an inner surface of the first substrate, the array element including a TFT, and the TFT including source and drain electrodes, one of the source and drain electrodes having at least one vertical protrusion, and another of the source and drain electrodes having at least two vertical protrusions, an organic electro luminescence diode formed on an inner surface of the second substrate, and a conductive spacer electrically connecting the array element and the organic electro luminescence diode.

In yet another aspect, the method of fabricating an organic electro luminescence device includes forming a gate line, forming a data line intersecting the gate line and defining a pixel area, forming a power line parallel to the data line, and forming an array element in the pixel area and corresponding to an organic electro luminescence diode, the forming of the array element including forming a switching TFT, a drive TFT and a storage capacitor, and the forming of the drive TFT including forming source and drain electrodes, one of the source and drain electrodes having at least one vertical protrusion, and another of the source and drain electrodes having at least two vertical protrusions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 4:
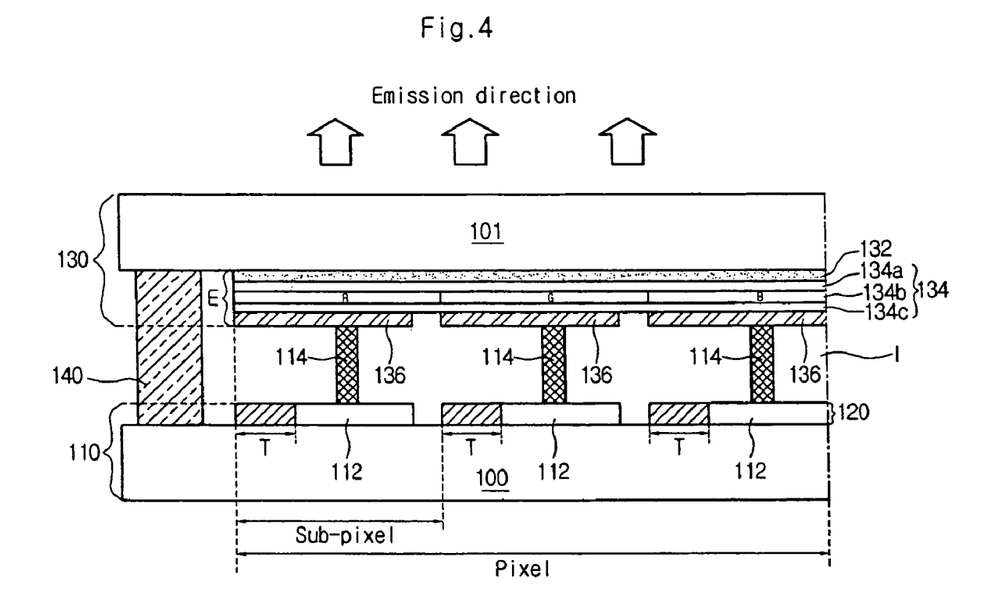
FIG. 4 is a schematic sectional view of a dual panel type organic electro luminescence device according to an embodiment of the present invention.

FIG. 4 is a schematic sectional view of a dual panel type organic electro luminescence device according to an embodiment of the present invention. However, the present invention is not limited to the dual panel type. In FIG. 4, an organic electro luminescent device may include first and second substrates 110 and 130 arranged facing each other with a predetermined gap I therebetween. The first and second substrates 110 and 130 may be attached to each other by a seal pattern 140 along edges of the first and second substrates 110 and 130.

In addition, an array element 120 may be formed on a transparent substrate 100 of the first substrate 110. The array element 120 may include a thin film transistor (TFT) T and an electric connecting portion 112 connected to the TFT T. The electric connecting portion 112 may extend from an electrode defining the TFT T, e.g., a source electrode or a drain electrode. Alternatively, the electric connecting portion 112 may be formed by patterning a separate metal material and connected to one of the source electrode and drain electrode of the TFT T. The TFT T may be a drive TFT.

Further, an organic electro luminescence diode E may be formed on a transparent substrate 101 of the second substrate 130. The organic electro luminescence diode E may include a first electrode 132 as a common electrode, an organic electro luminescence layer 134 formed under the first electrode 132, and a second electrode 136 formed under the organic electro luminescence layer 134.

The organic electro luminescence layer 134 may be patterned to correspond to a sub-pixel, and may include a light emission layer 134b, a first organic material layer 134a formed on a top of the emission layer 134b, and a second organic material layer 134c formed on a bottom of the emission layer 134b. The light emission layer 134b may include an emission material having one of red, green and blue colors patterned thereon to correspond to the sub-pixel. The first and second organic material layers 134a and 134b may include an organic electro luminescence material based on an arrangement of anode and cathode electrodes. For example, when the first electrode 132 is the anode electrode and the second electrode 136 is the cathode electrode, the first organic material layer 134a may include a hole doping layer and a hole carrying layer and the second organic material layer 134c may include an electron doping layer and an electron carrying layer.

Moreover, the TFT T may be connected to the organic electro luminescence diode E via conductive spacers 114. The conductive spacers 114 may be parallel to the seal pattern 140 and may contact the second electrode 136 and the electric connecting portion 112. The conductive spacers 114 may include a malleable metal material having a low resistance value, and may be formed on the first substrate 110.

According to an embodiment of the present invention, the electro luminescence device is a top emission type electro luminescence device which emits light emitted from the organic electro luminescence layer 134 toward the second substrate 130. Thus, the first electrode 132 may be formed of a transparent conductive material while the second electrode 136 may be formed of nontransparent conductive material to prevent the interference caused by light reflection emitted downward. In addition, the predetermined gap I between the first and second substrates 110 and 130 may be filled with nitrogen.

Since the array element 120 and the organic electro luminescence diode E are formed on different substrates, the yield of the array element 120 does not affect the yield of the organic electro luminescence diode E. Thus, a production management for each element is improved. In addition, the design of the array element 120 is not restricted by limitations arising from sharing on a same substrate as the organic electro luminescence diode E. For example, the array element 120 may be arranged in a matrix manner in an array region of the first substrate 110, and may include a switching TFT, a drive TFT and a storage capacitor in each sub-pixel. Each of the switching and drive TFTs may include an active layer formed of amorphous silicon. To improve the mobility of the drive TFT, the source/drain electrode of the drive TFT may be formed in teeth of a comb, i.e., in a plurality of vertical projections. The source/drain electrodes of the drive TFT may be engaged with each other in a finger shape.

Further, since the TFT can be designed without considering the aperture rate, the process efficiency of the array element can be improved, thereby providing a high aperture rate/high resolution product. Moreover, since the device is formed in the dual panel type, the infiltration of the outer air can be effectively prevented, thereby increasing the product reliability.

Figure 5:
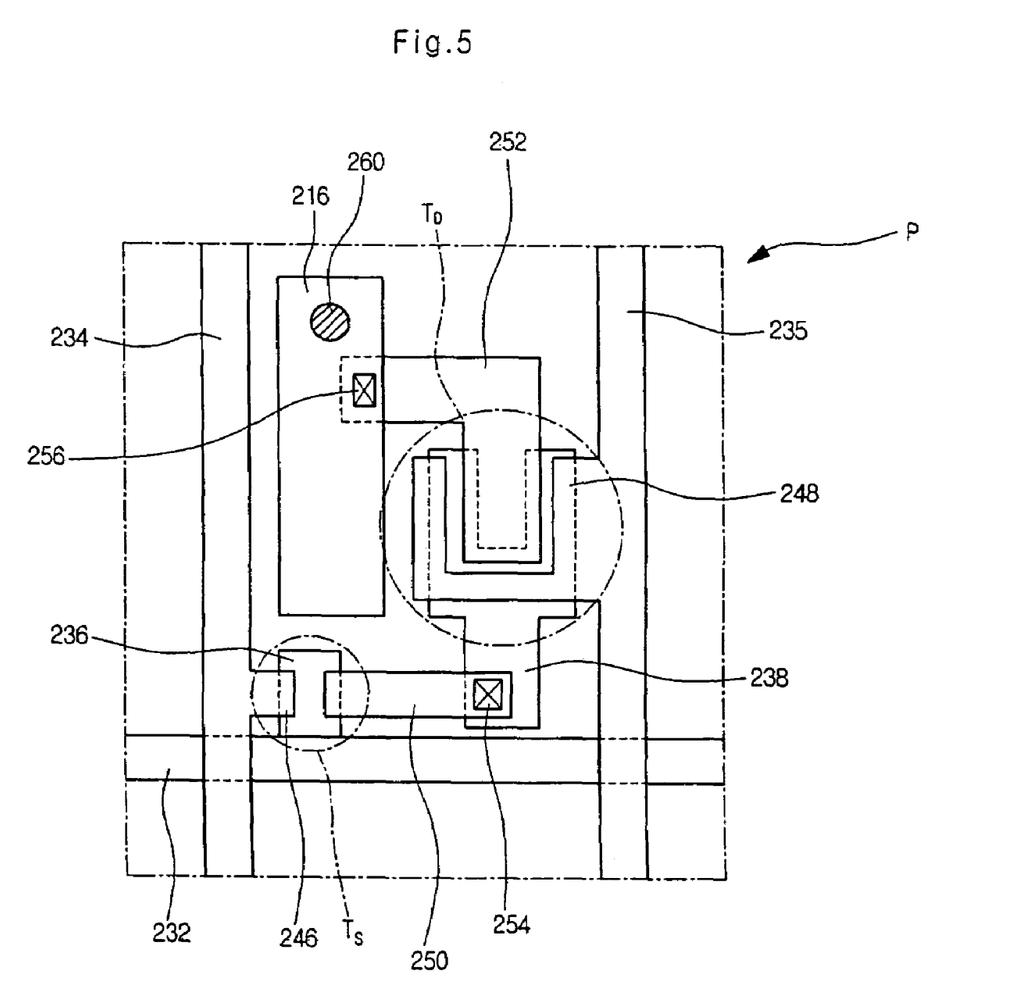
FIG. 5 is a plane view of a sub-pixel region of an organic electro luminescence device according to an embodiment of the present invention.

FIG. 5 is a plane view of a sub-pixel region of an organic electro luminescence device according to an embodiment of the present invention. In FIG. 5, a switching element Ts, a driving element $T_D$, and a storage capacitor $C_{ST}$ (not shown) may be formed in a sub-pixel P and may be a part of the array element 120 (shown in FIG. 4). Although not shown, the switching element Ts or the driving element $T_D$ may include more than one TFT. The sub-pixel P may be defined by the crossing of a gate line 232 and a data line 234, and an insulating layer may be formed between the gate line 232 and the data line 234. A power line 235 may be formed in parallel with the data line 234. Although only one sub-pixel P, one gate line 232, one data line 234 and one power line 235 are illustrated, a plurality of the gate and data lines 232 and 234 may be formed on the first substrate 110 defining a plurality of the sub-pixels P to correspond to the organic electro luminescence diode E (shown in FIG. 4), and a plurality of the power lines 235 may be formed parallel to the data lines 234.

The switching element Ts may include a gate electrode 236, an active layer (not shown), a source electrode 246, and a drain electrode 250. The driving element $T_D$ may include a gate electrode 238, an active layer (not shown), a source electrode 248, and a drain electrode 252. The gate electrode 236 of the switching element Ts may connect to the gate line 232, and the source electrode 246 of the switching element Ts may connect to the data line 234. In addition, the drain electrode 250 of the switching element Ts may connect to the gate electrode 238 of the driving element $T_D$ through a first contact hole 254. The source electrode 248 of the driving element $T_D$ may connect to the power line 235, and the drain electrode 252 of the driving element $T_D$ may connect to an electric contacting portion 216 through a second contact hole 256. Alternatively, the electric connecting portion 216 may be formed extending from the drain electrode 252 of the driving element $T_D$, thereby eliminating the second contact hole 256. The electric connecting portion 216 may be electrically connected to the second electrode (not shown) formed on the second substrate by a conductive spacer 260.

The switching element Ts and the driving element $T_D$ may include a TFT having an active layer formed of amorphous silicon. Since the mobility of the amorphous silicon is lower than that of crystal silicon by 0.5-1 $cm^2$/Vsec, a radio W/L of a width to a length of the driving element $T_D$ needs be increased to drive the organic luminescent layer. The width of the driving element $T_D$ is an overlapped portion between the active layer and the source/drain electrode 248 and 252 on the gate electrode 238. The length of the driving element $T_D$ is a distance between the source and drain electrodes 248 and 252.

Figure 6:
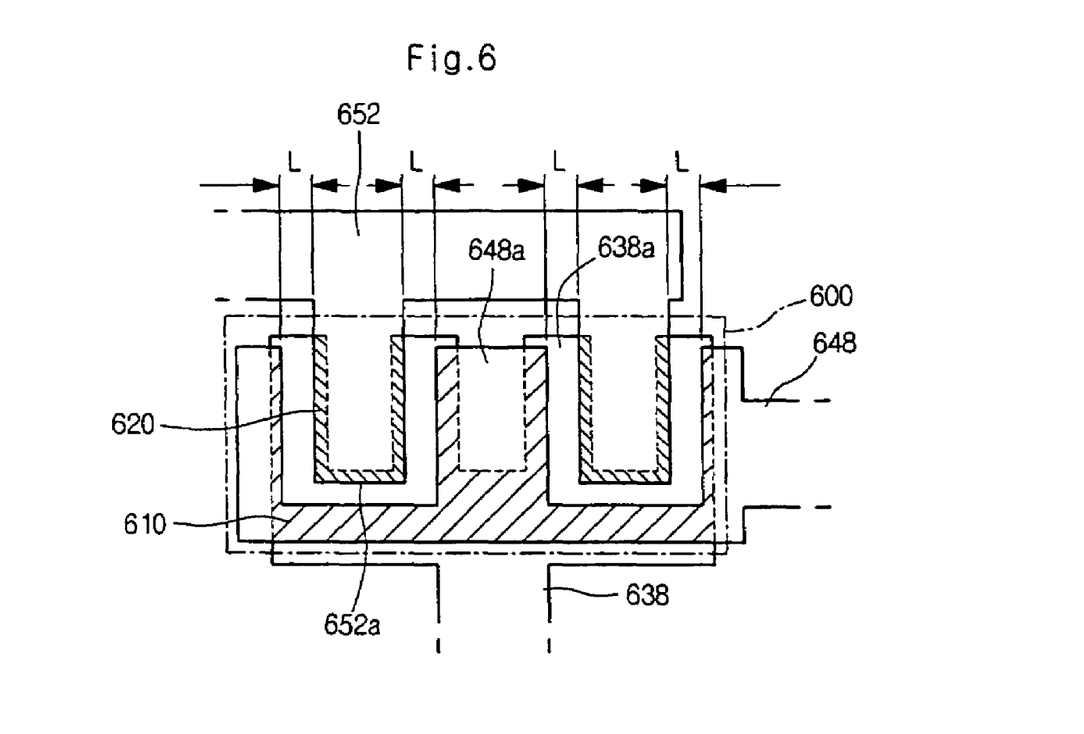
FIG. 6 is a detailed view of a portion of a driving element according to an embodiment of the present invention.

FIG. 6 is a detailed view of a portion of a driving element according to an embodiment of the present invention. In FIG. 6, a driving element, such as the driving element $T_D$ shown in FIG. 5, may include a gate electrode 638, a source electrode 648, a drain electrode 652, and an active layer 600. The gate electrode 638, the source electrode 648, and the drain electrode 652 may have a comb shape including a plurality of vertical protrusions 638a, 648a, and 652a, respectively. For example, the gate electrode 638 may have four vertical protrusions 638a, the source electrode 648 may have three vertical protrusions 648a, and the drain electrode 652 may have two vertical protrusions 652a.

The source electrode vertical protrusions 648a may overlap a first portion of the gate electrode vertical protrusions 638a. In addition, the drain electrode vertical protrusions 652a may overlap a second portion of the gate electrode vertical protrusions 638a. In particular, the source electrode vertical protrusions 648a and the drain electrode vertical protrusions 652a may engage each other with a distance L therebetween and in a non-overlapping finger-crossing-like manner. Further, the active layer 600 may be formed sandwiched between the gate electrode vertical protrusions 638a and the source/drain electrode vertical protrusions 648a and 652a.

As a result, a width W of the driving element is shown as the shaded region corresponding to an overlapped area of the active layer 600 and the source and drain electrodes 648 and 652 on the gate electrode 638, and the width is larger as compared to the related art. In particular, since the active layer 600 is formed under all of the overlapped portions of the source electrode 648 and the gate electrode 638 and the overlapped portion of the drain electrode 652 and the gate electrode 638, the width of the driving element is increased by about three times as shown in FIG. 6. Accordingly, the width-to-length ratio (W/L) of the driving element is increased, thereby improving the mobility of the driving element.

In addition, since the source and drain electrodes 648 and 652 may engage each other in a non-overlapping finger-crossing-like manner, the thermal dispersion effect and the current dispersion effect can be maintained, thereby reducing DC stress and increasing the life span of the driving element. Further, this finger-crossing structure may reduce the aperture rate of the bottom emission type organic electro luminescence device. However, since the present invention is directed to the top emission type, such a problem is not applied to the present invention.

Figure 7:
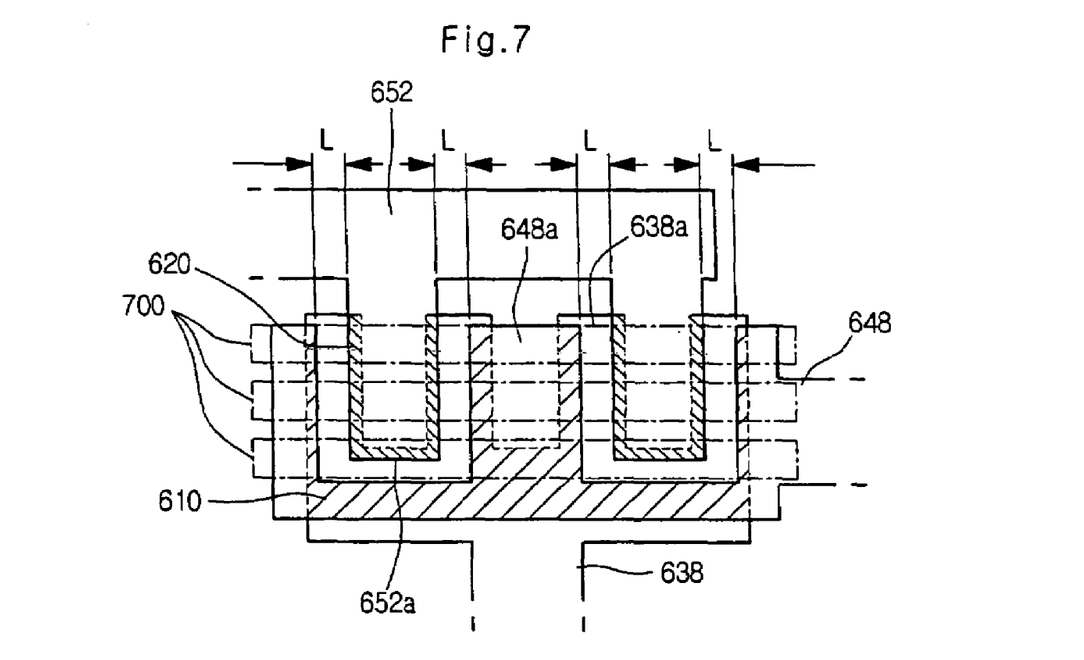
FIG. 7 is a detailed view of a portion of a driving element according to another embodiment of the present invention.

FIG. 7 is a detailed view of a portion of a driving element according to another embodiment of the present invention. As shown in FIG. 7, a driving element, such as the driving element $T_D$ shown in FIG. 5, may include a gate electrode 638, a source electrode 648, a drain electrode 652, and an active layer 700. The gate electrode 638, the source electrode 648, and the drain electrode 652 may have a comb shape including a plurality of vertical protrusions 638a, 648a, and 652a, respectively. For example, the gate electrode 638 may have four vertical protrusions 638a, the source electrode 648 may have three vertical protrusions 648a, and the drain electrode 652 may have two vertical protrusions 652a.

The source electrode vertical protrusions 648a may overlap a first portion of the gate electrode vertical protrusions 638a. In addition, the drain electrode vertical protrusions 652a may overlap a second portion of the gate electrode vertical protrusions 638a. In particular, the source electrode vertical protrusions 648a and the drain electrode vertical protrusions 652a may engage each other with a distance L therebetween and in a non-overlapping finger-crossing-like manner.

In addition, the active layer 700 may include a plurality of strips having a predetermined space therebetween and may overlap a portion where the source electrode vertical protrusions 648a engage the drain electrode vertical protrusions 652a. As a result, a width W of the driving element shown as the shaded region may be smaller as compared to the driving element shown in FIG. 6, but an overall size of the driving element may be increase to achieve a width as the driving element shown in FIG. 6. However, since the active layer 700 is in a strip shape, the signal mobility through the active layer 700 is improved. Thus, the driving element has a better performance as compared to the related art.

Further, since the source and drain electrodes 648 and 652 may be in a non-overlapping finger-crossing-like manner, the thermal dispersion effect and the current dispersion effect can be maintained, thereby reducing DC stress and increasing the life span of the driving element.

Accordingly, the organic electro luminescence device according to an embodiment of the present invention includes a driving element having source and drain electrodes in a non-overlapping finger-crossing-like manner. Thus, the driving element has an improved width-to-length ratio (W/L), thereby reducing DC stress and increasing the life span of the driving element. As a result, the organic electro luminescence device has a better product reliability.

It will be apparent to those skilled in the art that various modifications and variations can be made in the organic electro luminescence device of the present invention without departing from the sprit or scope of the invention. Thus, it is intended that the present invention covers the modifications and variations of this invention provided they come within the scope of the appended claims and their equivalents.

What is claimed is:

1. An organic electro luminescence device, comprising:
   a gate line;
   a data line intersecting the gate line and defining a pixel area;
   a power line parallel to the data line;
   an array element formed in the pixel area and corresponding to an organic electro luminescence diode, the array element including a switching TFT, a drive TFT and a storage capacitor, and the drive TFT including source and drain electrodes, the source electrode having a plurality of vertical protrusions, and the drain electrode having a plurality of vertical protrusions; and
   a gate electrode having a comb shape with a plurality of vertical protrusions, the source electrode vertical protrusions overlapping a first portion of the gate electrode vertical protrusions, and the drain electrode vertical protrusions overlapping a second portion of the gate electrode vertical protrusions.

2. The organic electro luminescence device according to claim 1, wherein the source electrode vertical protrusions engage the drain electrode vertical protrusions in a non-overlapping, finger-crossing-like manner.

3. The organic electro luminescence device according to claim 1, wherein the organic electro luminescence diode comprises:
   a first electrode;
   an organic electro luminescence layer formed under the first electrode; and
   a second electrode formed under the organic electro luminescence layer.

4. The organic electro luminescence device according to claim 3, wherein the organic electro luminescence layer comprises a light emission layer on which an emission material having one of red, green and blue colors is patterned thereon, a first organic material layer formed on a top surface of the emission layer, and a second organic material layer formed on a bottom surface of the emission layer.

5. The organic electro luminescence device according to claim 1, wherein the drive TFT further comprises:
   an active layer formed above the gate electrode vertical protrusions, and below the source and drain electrode vertical protrusions.

6. The organic electro luminescence device according to claim 5, wherein the active layer has a rectangular shape covering the gate electrode vertical protrusions and overlapping the source and drain electrode vertical protrusions.

7. The organic electro luminescence device according to claim 5, wherein the active layer includes a plurality of strips overlapping a region where the source electrode vertical protrusions engage the drain electrode vertical protrusions.

8. The organic electro luminescence layer according to claim 5, wherein the gate electrode, the source electrode and the drain electrode respectively have different numbers of vertical protrusions.

9. The organic electro luminescence layer device according to claim 1, wherein the array element and the organic electro luminescence diode are formed on different substrates.

10. An organic electro luminescence device, comprising:
    first and second substrates facing each other with a predetermined space therebetween;

an array element formed on an inner surface of the first substrate, the array element including a TFT, and the TFT including source and drain electrodes, the source electrode having a plurality of vertical protrusions, and the drain electrode having a plurality of vertical protrusions;

a gate electrode having a comb shape with a plurality of vertical protrusions, the source electrode vertical protrusions overlapping a first portion of the gate electrode vertical protrusions, and the drain electrode vertical protrusions overlapping a second portion of the gate electrode vertical protrusions;

an organic electro luminescence diode formed on an inner surface of the second substrate; and a conductive spacer electrically connecting the array element and the organic electro luminescence diode.

11. The organic electro luminescence device according to claim 10, wherein the source electrode vertical protrusions engage the drain electrode vertical protrusions in a non-overlapping, finger-crossing-like manner.

12. The organic electro luminescence device according to claim 10, wherein the organic electro luminescence diode comprises:
a first electrode including a transparent metal material;
an organic electro luminescence layer formed corresponding to a pixel area; and
a second electrode.

13. The organic electro luminescence device according to claim 12, wherein the organic electro luminescence layer comprises a light emission layer on which an emission material having one of red, green and blue colors is patterned thereon, a first organic material layer formed on a top surface of the emission layer, and a second organic material layer formed on a bottom surface of the emission layer.

14. The organic electro luminescence device according to claim 10, wherein the TFT further comprises:
an active layer formed above the gate electrode vertical protrusions, and below the source and drain electrode vertical protrusions.

15. The organic electro luminescence device according to claim 14, wherein the active layer has a rectangular shape covering the gate electrode vertical protrusions and overlapping the source and drain electrode vertical protrusions.

16. The organic electro luminescence layer device according to claim 14, wherein the active layer includes a plurality of strips overlapping a region where the source electrode vertical protrusions engage the drain electrode vertical protrusions.

17. The organic electro luminescence layer according to claim 14, wherein the gate electrode, the source electrode and the drain electrode respectively have different numbers of vertical protrusions.

18. A method of fabricating an organic electro luminescence device, comprising:
forming a gate line;
forming a data line intersecting the gate line and defining a pixel area;
forming a power line parallel to the data line;
forming an array element in the pixel area and corresponding to an organic electro luminescence diode, the forming of the array element including forming a switching TFT, a drive TFT and a storage capacitor, and the forming of the drive TFT including forming source and drain electrodes, the source electrode having a plurality of vertical protrusions, and the drain electrode having a plurality of vertical protrusions; and
forming a gate electrode having a comb shape with a plurality of vertical protrusions, the source electrode vertical protrusions overlapping a first portion of the gate electrode vertical protrusions, and forming the drain electrode vertical protrusions overlapping a second portion of the gate electrode vertical protrusions.

19. The method according to claim 18, wherein the source electrode vertical protrusions and the drain electrode vertical protrusions are in a non-overlapping, finger-crossing-like manner.

* * * * *